(12) United States Patent
Choi et al.

(10) Patent No.: US 9,390,859 B2
(45) Date of Patent: Jul. 12, 2016

(54) MULTILAYER CERAMIC CAPACITOR AND BOARD WITH THE SAME MOUNTED THEREON

(71) Applicant: SAMSUNG ELECTRO-MECHANICS CO., LTD., Suwon-Si, Gyeonggi-Do (KR)

(72) Inventors: Young Don Choi, Suwon-Si (KR); Hai Joon Lee, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 101 days.

(21) Appl. No.: 14/282,836

(22) Filed: May 20, 2014

(65) Prior Publication Data

US 2015/0213956 A1    Jul. 30, 2015

(30) Foreign Application Priority Data

Jan. 27, 2014 (KR) .................. 10-2014-0009379

(51) Int. Cl.
*H01G 4/30* (2006.01)
*H01G 4/12* (2006.01)
*H01G 4/005* (2006.01)
*H05K 1/18* (2006.01)
*H01G 2/06* (2006.01)

(52) U.S. Cl.
CPC ............... *H01G 4/30* (2013.01); *H01G 2/065* (2013.01); *H01G 4/005* (2013.01); *H01G 4/12* (2013.01); *H05K 1/181* (2013.01); *H05K 2201/10015* (2013.01)

(58) Field of Classification Search
USPC ........................................................ 174/260
See application file for complete search history.

(56) References Cited

U.S. PATENT DOCUMENTS

| | | | | |
|---|---|---|---|---|
| 5,321,573 A * | 6/1994 | Person | ............... | H02H 9/044 361/111 |
| 6,243,253 B1 * | 6/2001 | DuPre | ............... | H01G 2/065 361/301.4 |
| 6,587,327 B1 * | 7/2003 | Devoe | ............... | H01G 4/228 361/306.3 |
| 7,075,776 B1 * | 7/2006 | Devoe | ............... | H01G 4/30 361/303 |
| 8,315,033 B2 * | 11/2012 | Takashima | ............... | H01G 4/012 361/303 |
| 8,446,705 B2 * | 5/2013 | Ritter | ............... | H01G 4/005 361/301.4 |
| 2004/0257748 A1 * | 12/2004 | Ritter | ............... | H01G 4/012 361/306.3 |
| 2008/0080122 A1 * | 4/2008 | Togashi | ............... | H01G 4/232 361/303 |
| 2010/0128413 A1 | 5/2010 | Takashima et al. | | |

FOREIGN PATENT DOCUMENTS

JP    2010-129637 A    6/2010
JP    2012-069766 A    4/2012

* cited by examiner

*Primary Examiner* — Timothy Thompson
*Assistant Examiner* — Michael F McAllister
(74) *Attorney, Agent, or Firm* — McDermott Will & Emery LLP (57) ABSTRACT

A multilayer ceramic capacitor may include: a ceramic body including a plurality of dielectric layers; a first capacitor part including a first internal electrode and a second internal electrode disposed in the ceramic body; second to fifth capacitor parts including a third internal electrode having a first lead, a fourth internal electrode having a second lead, a fifth internal electrode having a third lead, and a sixth internal electrode having a fourth lead, the third to sixth internal electrodes being disposed on one dielectric layer in the ceramic body, and a seventh internal electrode disposed on another dielectric layer in the ceramic body; and a first external electrode and a second external electrode. The first capacitor part and the second to fifth capacitor parts may be connected in parallel to each other.

16 Claims, 11 Drawing Sheets

MULTILAYER CERAMIC CAPACITOR AND BOARD WITH THE SAME MOUNTED THEREON

CROSS-REFERENCE TO RELATED APPLICATION

This application claims the benefit of Korean Patent Application No. 10-2014-0009379 filed on Jan. 27, 2014, with the Korean Intellectual Property Office, the disclosure of which is incorporated herein by reference.

BACKGROUND

The present disclosure relates to a multilayer ceramic capacitor and a board with the same mounted thereon.

Multilayer ceramic capacitors, multilayer chip electronic components, are chip-type condensers mounted on printed circuit boards of various electronic products such as display devices, for example, liquid crystal displays (LCDs), plasma display panels (PDPs), or the like, computers, smart phones, mobile phones, and the like, to be charged with or discharge electricity.

Since such a multilayer ceramic capacitor (MLCC) has advantages such as a small size, high capacitance, easiness of mounting, or the like, the multilayer ceramic capacitor may be used as a component of various electronic devices.

The multilayer ceramic capacitor may have a structure composed of a plurality of dielectric layers and internal electrodes alternately stacked between the dielectric layers and having different polarities.

Particularly, in a power supply device for a central processing unit (CPU) of a computer, or the like, voltage noise due to a rapid change in load current may be generated during a process of supplying low voltage.

Therefore, the multilayer capacitor has been widely used in the power supply device as a capacitor for decoupling in order to suppress voltage noise.

The multilayer ceramic capacitor for decoupling should have low equivalent series inductance (ESL) as an operation frequency is increased. Various researches into technology for decreasing ESL have been actively conducted.

Further, in order to more stably supply power, the multilayer ceramic capacitor for decoupling should have controllable equivalent series resistance (ESR) characteristics.

In the case in which ESR of the multilayer ceramic capacitor is lower than the required level, an impedance peak at a parallel resonance frequency generated due to ESL of a capacitor and plane capacitance of a micro processor package may increase, and impedance at a series resonance frequency of a capacitor may excessively decrease.

Therefore, in order to implement flat impedance characteristics in a power distribution network, the ESR characteristics of the multilayer ceramic capacitor for decoupling are required to be easily controlled.

Meanwhile, in accordance with the trend toward multifunction and a complex structure of CPU, power consumption has increased, and a rapid and large transient current may be generated in power. Therefore, importance of power integrity (PI) has increased.

The PI is to satisfy basic performance of a CPU by designing power impedance to be further decreased to suppress a change in a voltage generated according to a transient current.

Generally, a multilayer ceramic capacitor has been used as a capacitor for decoupling in order to decrease power impedance. In this case, since the transient current generated in power is a wide band current, power impedance should also be decreased in a wide band.

In addition, in accordance with the recent trend toward rapid development of mobile terminals such as tablet personal computers (PCs), ultra books, or the like, microprocessors have also been converted into miniaturized and highly integrated products.

Therefore, an area of the printed circuit board has decreased, and amounting space of the capacitor for decoupling has also been limited. Multilayer ceramic capacitors capable of being appropriately used, satisfying such a limited mounting space, have been demanded thereby.

SUMMARY

An aspect of the present disclosure may provide a multilayer ceramic capacitor and a board having the same mounted thereon.

According to some embodiments of the present disclosure, a multilayer ceramic capacitor may include: a ceramic body including a plurality of dielectric layers and having first and second main surfaces opposing each other, first and second side surfaces opposing each other, and first and second end surfaces opposing each other; a first capacitor part including a first internal electrode disposed in the ceramic body and exposed to the first end surface and a second internal electrode disposed in the ceramic body and exposed to the second end surface; second to fifth capacitor parts including a third internal electrode having a first lead exposed to the first side surfaces, a fourth internal electrode having a second lead exposed to the second side surface, a fifth internal electrode having a third lead exposed to the first side surface, and a sixth internal electrode having a fourth lead exposed to the second side surface, the third to sixth internal electrodes being disposed on one dielectric layer in the ceramic body, and a seventh internal electrode disposed on another dielectric layer in the ceramic body; and a first external electrode disposed on the first end surface of the ceramic body and extended to the first and second side surfaces and the first and second main surfaces, and a second external electrode disposed on the second end surface of the ceramic body and extended to the first and second side surfaces and the first and second main surfaces. The first capacitor part and the second to fifth capacitor parts may be connected in parallel to each other.

The first and second internal electrodes may be disposed in a central portion of the ceramic body, and the third to seventh internal electrodes may be disposed on and below the first and second internal electrodes.

The first lead of the third internal electrode and the second lead of the fourth internal electrode may be connected to the first external electrode, and the third lead of the fifth internal electrode and the fourth lead of the sixth internal electrode may be connected to the second external electrode.

The second capacitor part may be disposed in a region in which the third and seventh internal electrodes are overlapped with each other.

The third capacitor part may be disposed in a region in which the fourth and seventh internal electrodes are overlapped with each other.

The fourth capacitor part may be disposed in a region in which the fifth and seventh internal electrodes are overlapped with each other.

The fifth capacitor part may be disposed in a region in which the sixth and seventh internal electrodes are overlapped with each other.

The seventh internal electrode may have a groove disposed in the same regions thereof as regions in which the third to sixth internal electrodes are spaced apart from each other.

The seventh internal electrode may be disposed as two electrode patterns spaced apart from each other in a width direction of the ceramic body.

According to some embodiments of the present disclosure, a board having a multilayer ceramic capacitor mounted thereon may include: a printed circuit board having first and second electrode pads disposed thereon; and a multilayer ceramic capacitor mounted on the printed circuit board. The multilayer ceramic capacitor may include a ceramic body including a plurality of dielectric layers and having first and second main surfaces opposing each other, first and second side surfaces opposing each other, and first and second end surfaces opposing each other, a first capacitor part including a first internal electrode disposed in the ceramic body and exposed to the first end surface and a second internal electrode disposed in the ceramic body and exposed to the second end surface, second to fifth capacitor parts including a third internal electrode having a first lead exposed to the first side surfaces, a fourth internal electrode having a second lead exposed to the second side surface, a fifth internal electrode having a third lead exposed to the first side surface, and a sixth internal electrode having a fourth lead exposed to the second side surface, the third to sixth internal electrodes being disposed on one dielectric layer in the ceramic body, and a seventh internal electrode disposed on another dielectric layer in the ceramic body, and a first external electrode disposed on the first end surface of the ceramic body and extended to the first and second side surfaces and the first and second main surfaces and a second external electrode disposed on the second end surface of the ceramic body and extended to the first and second side surfaces and the first and second main surfaces, the first capacitor part and the second to fifth capacitor parts being connected in parallel to each other.

The first and second internal electrodes may be disposed in a central portion of the ceramic body, and the third to seventh internal electrodes may be disposed on and below the first and second internal electrodes.

The first lead of the third internal electrode and the second lead of the fourth internal electrode may be connected to the first external electrode, and the third lead of the fifth internal electrode and the fourth lead of the sixth internal electrode may be connected to the second external electrode.

The second capacitor part may be disposed in a region in which the third and seventh internal electrodes are overlapped with each other.

The third capacitor part may be disposed in a region in which the fourth and seventh internal electrodes are overlapped with each other.

The fourth capacitor part may be disposed in a region in which the fifth and seventh internal electrodes are overlapped with each other.

The fifth capacitor part may be disposed in a region in which the sixth and seventh internal electrodes are overlapped with each other.

The seventh internal electrode may have a groove disposed in the same regions as regions in which the third to sixth internal electrodes are spaced apart from each other.

The seventh internal electrode may be disposed as two electrode patterns spaced apart from each other in a width direction of the ceramic body.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Capacitor

Figure 1:
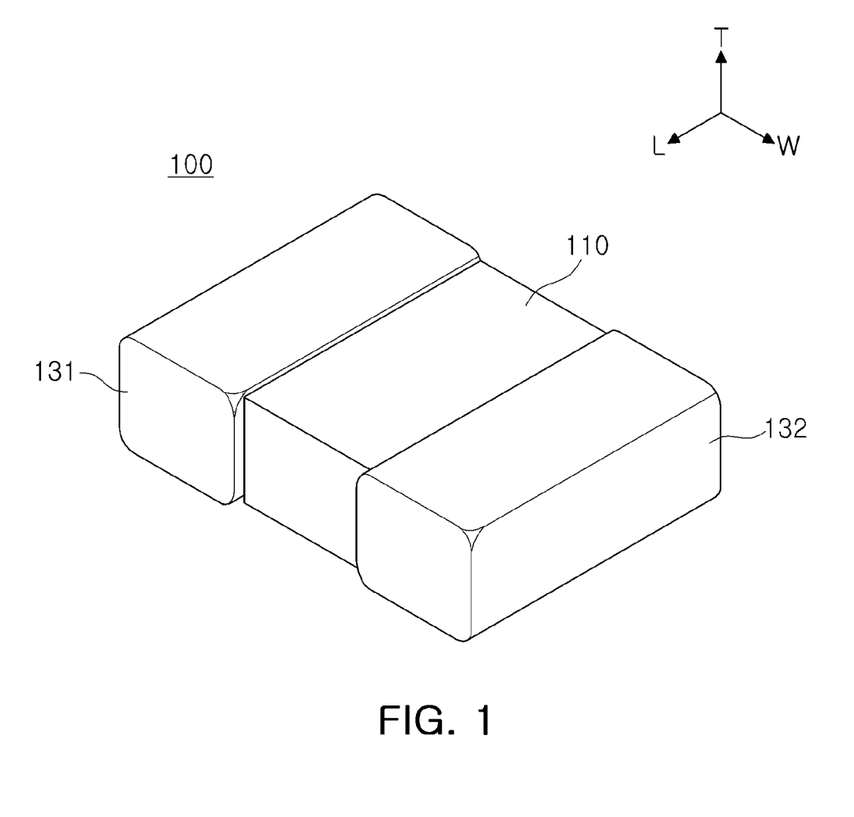
FIG. 1 is a perspective diagram of a multilayer ceramic capacitor according to a first exemplary embodiment of the present disclosure.

FIG. 1 is a perspective diagram of a multilayer ceramic capacitor according to a first exemplary embodiment of the present disclosure.

Figure 2:
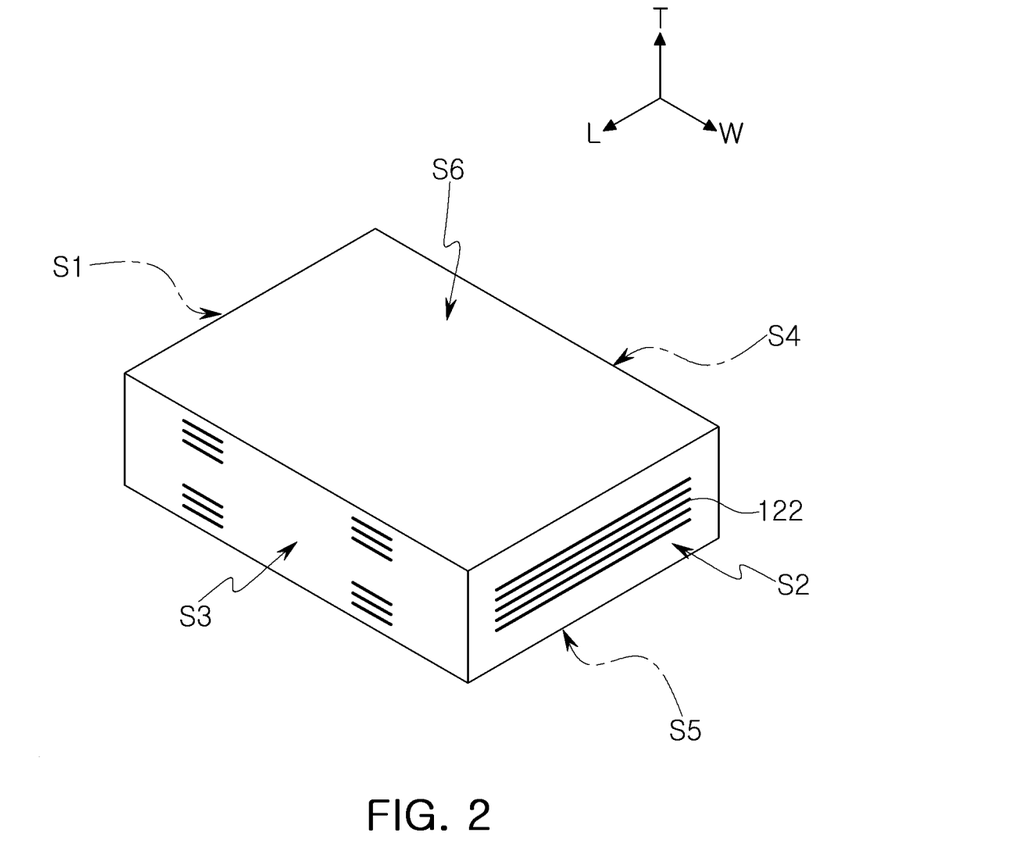
FIG. 2 is a drawing illustrating a ceramic body of the multilayer ceramic capacitor shown in FIG. 1.

FIG. 2 is a drawing illustrating a ceramic body of the multilayer ceramic capacitor shown in FIG. 1.

Figure 3A:
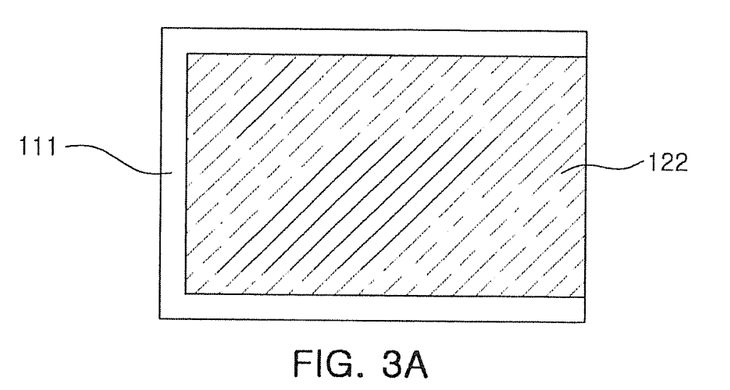
FIGS. 3A and 3B are each a plan diagram illustrating first and second internal electrodes used in the multilayer ceramic capacitor shown in FIG. 1.
Figure 3B:
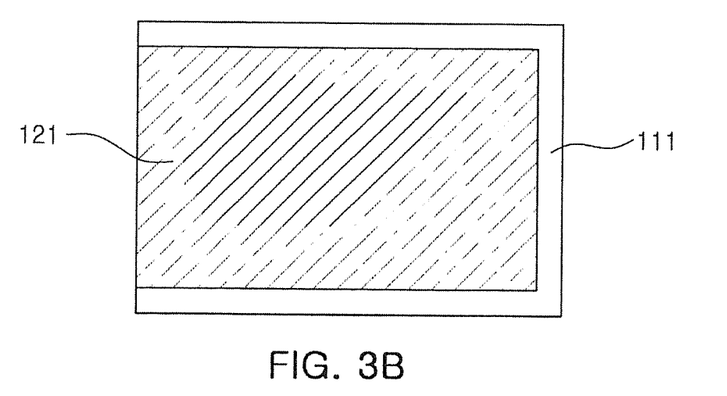

FIGS. 3A and 3B are each a plan diagram illustrating first and second internal electrodes used in the multilayer ceramic capacitor shown in FIG. 1.

Figure 4A:
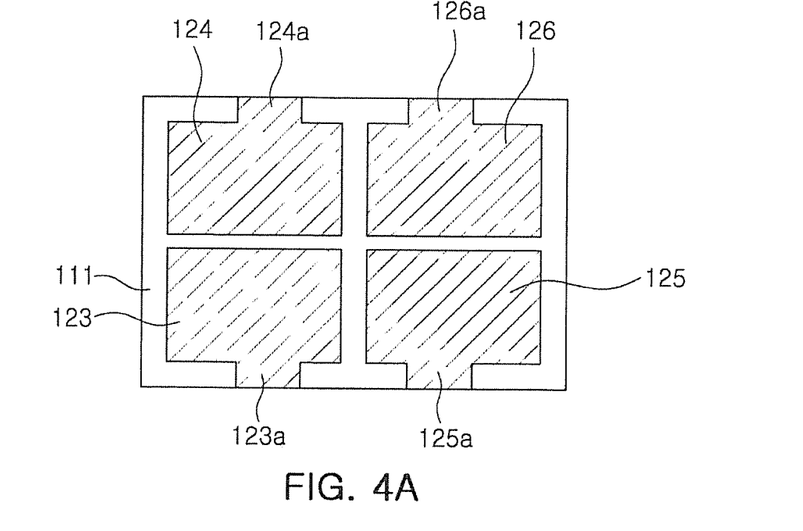
FIGS. 4A and 4B are each a plan diagram illustrating third to seventh internal electrodes used in the multilayer ceramic capacitor shown in FIG. 1.
Figure 4B:
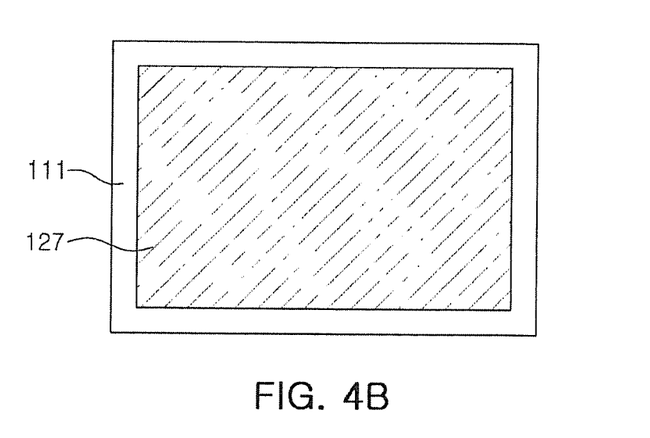

FIGS. 4A and 4B are each a plan diagram illustrating third to seventh internal electrodes used in the multilayer ceramic capacitor shown in FIG. 1.

Referring to FIGS. 1 through 4, the multilayer ceramic capacitor 100 according to the first exemplary embodiment of the present disclosure may include a ceramic body 110 including a plurality of dielectric layers 111 and having first and second main surfaces opposing each other, first and second side surfaces opposing each other, and first and second end surfaces opposing each other.

In the multilayer ceramic capacitor according to the first exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same as a direction in which dielectric layers are stacked, for example, a 'stacking direction'.

In the exemplary embodiment of the present disclosure, the ceramic body 110 may have first and second main surfaces S5 and S6 opposing each other, and first and second side surfaces S3 and S4 and first and second end surfaces S1 and S2 that connect the first and second main surfaces to each other.

A shape of the ceramic body 110 is not particularly limited, but may be a hexahedral shape as shown in the drawings.

The ceramic body 110 may be formed by stacking the plurality of dielectric layers, and a plurality of internal electrodes 121 and 122 (sequentially first and second internal electrodes) may be disposed in the ceramic body 110 so as to be separated from each other, having the dielectric layer therebetween.

The plurality of dielectric layers 111 configuring the ceramic body 110 may be in a sintered state and be integrated with each other so as not to discern a boundary between dielectric layers adjacent to each other without using a scanning electron microscope (SEM).

The dielectric layer 111 may be formed by sintering a ceramic green sheet containing a ceramic powder, an organic solvent, and an organic binder. As the ceramic powder, a high k material, a barium titanate ($BaTiO_3$) based material, a strontium titanate ($SrTiO_3$) based material, or the like, may be used. However, the ceramic powder is not limited thereto.

The first and second internal electrodes 121 and 122 may be disposed to face each other, having the dielectric layer 111 therebetween, and may alternately be exposed to the first or second end surface S1 or S2.

According to the first exemplary embodiment of the present disclosure, the first and second internal electrodes 121 and 122 may be formed of a conductive paste containing a conductive metal.

The conductive metal may be nickel (Ni), copper (Cu), palladium (Pd), or an alloy thereof, but is not limited thereto.

An internal electrode layer may be printed on a ceramic green sheet configuring the dielectric layer using the conductive paste by a printing method such as a screen printing method or a gravure printing method.

The ceramic green sheets having the internal electrode printed thereon may be alternately stacked to then be sintered, thereby forming the ceramic body.

In addition, the multilayer ceramic capacitor 100 may include first and second external electrodes 131 and 132 formed on the first and second end surfaces S1 and S2 of the ceramic body 110 and electrically connected to the first and second internal electrodes 121 and 122.

The first and second external electrodes 131 and 132 may be disposed to be spaced apart from each other on the first main surface S5 of the ceramic body 110.

The first external electrode 131 may be formed on the first end surface S1 of the ceramic body 110 and extended to the first and second side surfaces S3 and S4 and the first and second main surfaces S5 and S6, and the second external electrode 132 may be formed on the second end surface S2 of the ceramic body 110 and extended to the first and second side surface S3 and S4 and the first and second main surfaces S5 and S6.

The first and second external electrodes 131 and 132 may be formed of a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the first and second external electrodes 131 and 132 is not particularly limited. For example, the first and second external electrodes 131 and 132 may be formed on the ceramic body by a printing method, a dipping method, a plating method, or the like.

Thereafter, a plating layer may be further formed on the first and second external electrodes 131 and 132.

According to the first exemplary embodiment of the present disclosure, a mounting surface of the multilayer ceramic capacitor 100 may be the first or second main surface S5 or S6 of the ceramic body 110.

Referring to FIGS. 3A and 3B and 4A and 4B, the multilayer ceramic capacitor 100 may include a first capacitor part C1 including a first internal electrode 121 formed in the ceramic body 110 and exposed to the first end surface S1 and a second internal electrode 122 formed in the ceramic body 110 and exposed to the second end surface S2 and second to fifth capacitor parts Cc1 to Cc4 including a third internal electrode 123 having a first lead 123a exposed to the first side surfaces S3, a fourth internal electrode 124 having a second lead 124a exposed to the second side surface S4, a fifth internal electrode 125 having a third lead 125a exposed to the first side surface S3, and a sixth internal electrode 126 having a fourth lead 126a exposed to the second side surface S4, the third to sixth internal electrodes 123 to 126 being formed on one dielectric layer 111 in the ceramic body 110, and a seventh internal electrode 127 formed on another dielectric layer 111 in the ceramic body 110.

The first capacitor part C1 including the first internal electrode 121 exposed to the first end surface S1 and the second internal electrode 122 exposed to the second end surface S2 and the second to fifth capacitor parts Cc1 to Cc4 may be connected in parallel to each other as described below.

In the case of the second to fifth capacitor parts Cc1 to Cc4, the first lead 123a of the third internal electrode 123 and the second lead 124a of the fourth internal electrode 124 may be exposed to the first and second side surfaces S3 and S4 of the ceramic body 110 to thereby be connected to the first external electrode 131.

Further, the third lead 125a of the fifth internal electrode 125 and the fourth lead 126a of the sixth internal electrode 126 may be exposed to the first and second side surfaces S3 and S4 of the ceramic body 110 to thereby be connected to the second external electrode 132.

In the first exemplary embodiment of the present disclosure, the second capacitor part Cc1 may be formed in a region in which the third and seventh internal electrodes 123 and 127 are overlapped with each other.

In the first exemplary embodiment of the present disclosure, the third capacitor part Cc2 may be formed in a region in which the fourth and seventh internal electrodes 124 and 127 are overlapped with each other.

In the first exemplary embodiment of the present disclosure, the fourth capacitor part Cc3 may be formed in a region in which the fifth and seventh internal electrodes 125 and 127 are overlapped with each other.

In the first exemplary embodiment of the present disclosure, the fifth capacitor part Cc4 may be formed in a region in which the sixth and seventh internal electrodes 126 and 127 are overlapped with each other.

The number of each of the first and second internal electrodes 121 and 122 shown in FIGS. 3A and 3B is one, but at the time of actual application of an exemplary embodiment of the present disclosure, the internal electrodes may be provided in plural.

Similarly, the number of each of the third to seventh internal electrodes 123 to 127 shown in FIGS. 4A and 4B is one, but the third to seventh internal electrodes 123 to 127 may be provided in plural.

According to the first exemplary embodiment of the present disclosure, the first capacitor part C1 including the first internal electrode 121 exposed to the first end surface S1 and the second internal electrode 122 exposed to the second end surface S2 is connected in parallel to the second to fifth capacitor parts Cc1 to Cc4 including the third internal electrode 123 having the first lead 123a exposed to the first side surfaces S3, the fourth internal electrode 124 having the second lead 124a exposed to the second side surface S4, the fifth internal electrode 125 having the third lead 125a exposed to the first side surface S3, and the sixth internal electrode 126 having the fourth lead 126a exposed to the second side surface S4, the third to sixth internal electrodes 123 to 126 being formed on one dielectric layer 111 in the ceramic body 110, and the seventh internal electrode 127 formed on another dielectric layer 111 in the ceramic body 110, such that low impedance may be implemented in a relatively wide frequency region.

For example, in the multilayer ceramic capacitor according to the first exemplary embodiment of the present disclosure, three self resonances are observed in impedance characteristics, and a low impedance region may be extended, such that a change in voltage of power and noise may be efficiently decreased.

Therefore, as compared with the structure according to the related art, the impedance may be decreased and controlled in a relatively wide frequency region, and the number of capacitors for decoupling may be decreased, such that amounting space and cost may be decreased due to a decrease in the amount of components used.

Meanwhile, according to the first exemplary embodiment of the present disclosure, the first and second internal electrodes 121 and 122 may be disposed in a central portion of the ceramic body 110, and the third to seventh internal electrodes 123 to 127 may be disposed on and below the first and second internal electrodes 121 and 122.

The first and second internal electrodes 121 and 122 are disposed in the central portion of the ceramic body 110, and the third to seventh internal electrodes 123 to 127 are disposed on and below the first and second internal electrodes 121 and 122, such that in the case of using the multilayer ceramic capacitor in a high frequency region, an excellent impedance decreasing effect may be obtained.

For example, in order to obtain the excellent impedance decreasing effect in the high frequency region, at the time of mounting the multilayer ceramic capacitor on a board, when capacitance in a region of the multilayer ceramic capacitor, close to the mounting board, is relatively low, the impedance decrease effect in the high frequency region may be further excellent.

Therefore, the second to fifth capacitor parts Cc1 to Cc4 including the third to seventh internal electrodes 123 to 127 to thereby have lower capacitance are disposed on and below the first capacitor part C1 including the first and second internal electrodes 121 and 122, such that the excellent impedance decreasing effect may be obtained in the high frequency region.

Figure 5:
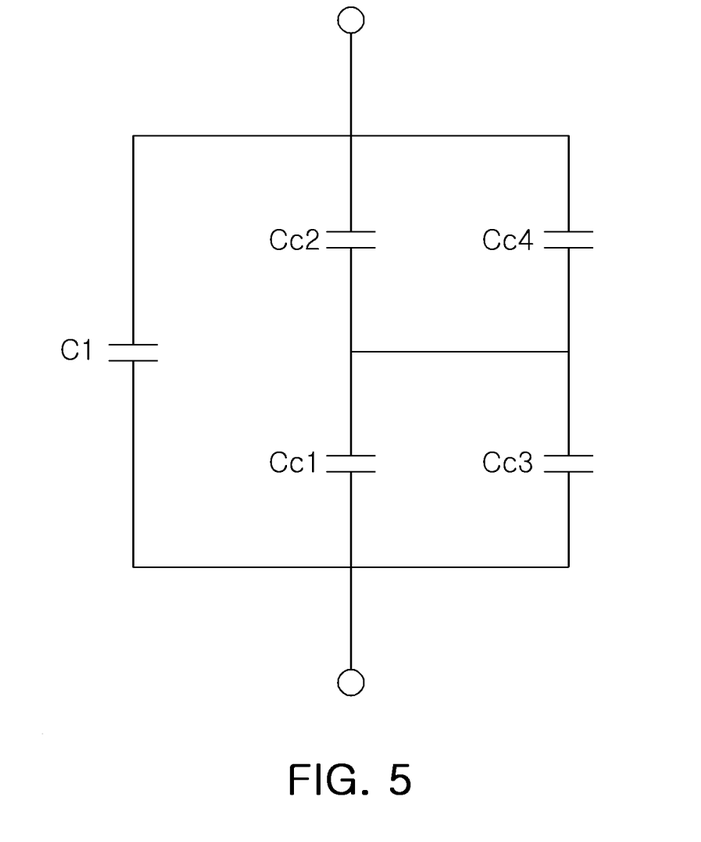
FIG. 5 is an equivalent circuit diagram of the multilayer ceramic capacitor shown in FIG. 1.

FIG. 5 is an equivalent circuit diagram of the multilayer ceramic capacitor shown in FIG. 1.

Referring to FIG. 5, the first capacitor part C1 including the first and second internal electrodes 121 and 122 and the second to fifth capacitor parts Cc1 to Cc4 including the third to seventh internal electrodes 123 to 127 may be connected in parallel with each other.

In addition, the second and third capacitor parts Cc1 and Cc2 may be connected in series to each other, the fourth and fifth capacitor parts Cc3 and Cc4 may be connected in series to each other, the second and fourth capacitor parts Cc1 and Cc3 may be connected in parallel to each other, and the third and fifth capacitor parts Cc2 and Cc4 may be connected in parallel to each other.

Due to such arrangement, in the multilayer ceramic capacitor according to the first exemplary embodiment of the present disclosure, three self resonances are observed in impedance characteristics, and a low impedance region may be increased, such that a change in voltage of power and noise may be efficiently decreased.

Therefore, as compared with the structure according to the related art, the impedance may be decreased and controlled in a relatively wide frequency region, and the number of capacitors for decoupling may be decreased, such that a mounting space and cost may be decreased due to the decrease in the amount of components used therein.

Figure 6:
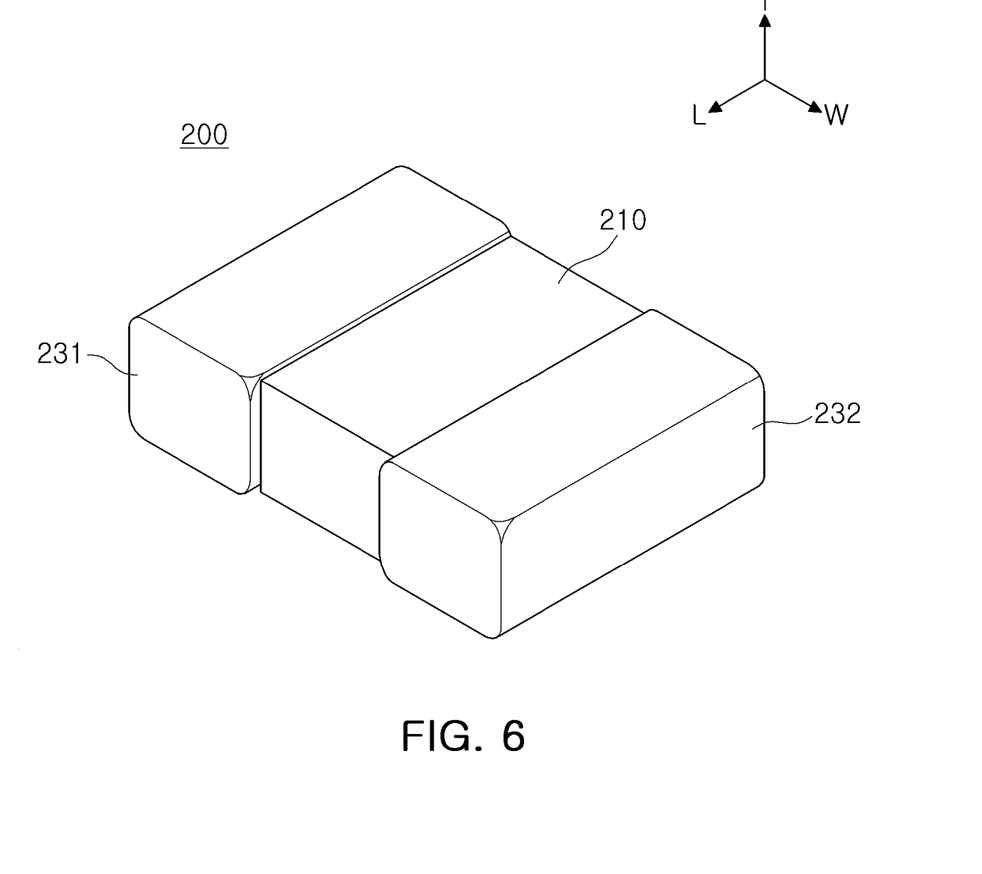
FIG. 6 is a perspective diagram of a multilayer ceramic capacitor according to a second exemplary embodiment of the present disclosure.

FIG. 6 is a perspective diagram of a multilayer ceramic capacitor according to the second exemplary embodiment of the present disclosure.

Figure 7A:
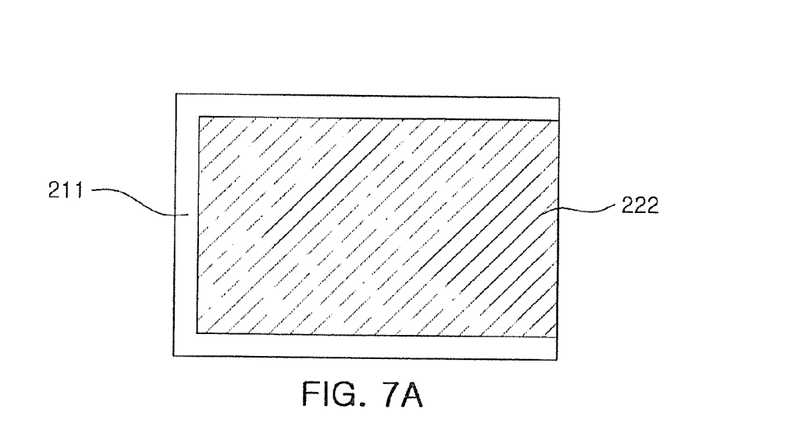
FIGS. 7A and 7B are each a plan diagram illustrating first and second internal electrodes used in the multilayer ceramic capacitor shown in FIG. 6.
Figure 7B:
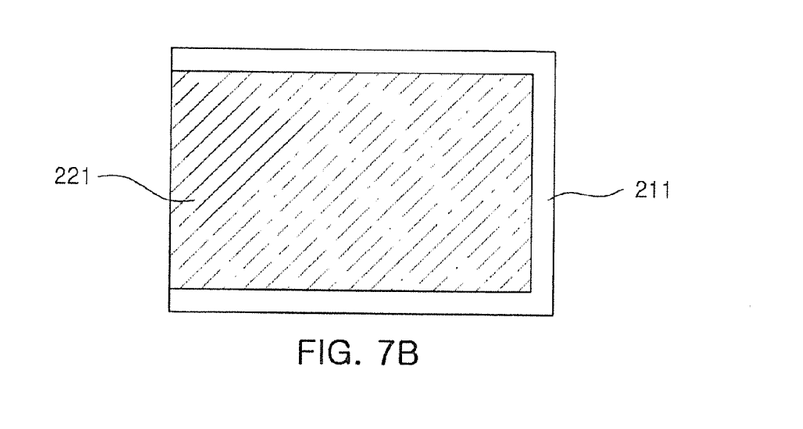

FIGS. 7A and 7B are each a plan diagram illustrating first and second internal electrodes used in the multilayer ceramic capacitor shown in FIG. 6.

Figure 8A:
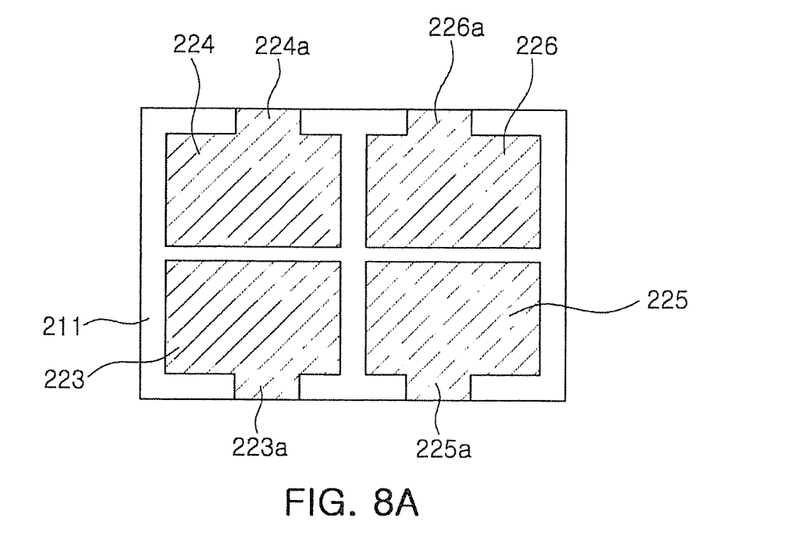
FIGS. 8A and 8B are each a plan diagram illustrating third to seventh internal electrodes used in the multilayer ceramic capacitor shown in FIG. 6.
Figure 8B:
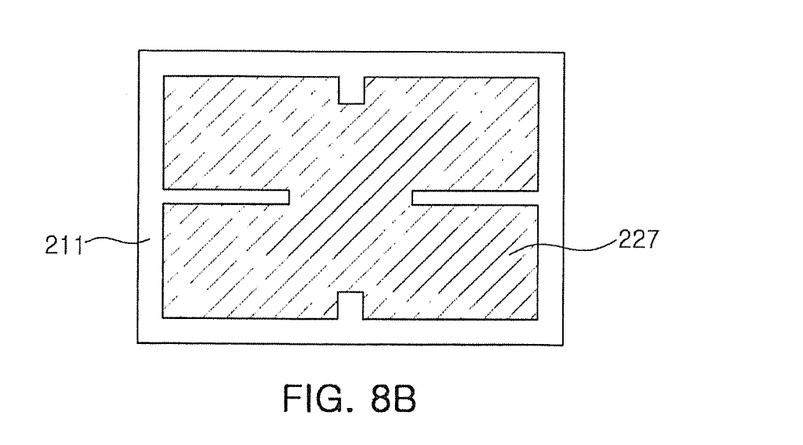

FIGS. 8A and 8B are each a plan diagram illustrating third to seventh internal electrodes used in the multilayer ceramic capacitor shown in FIG. 6.

Referring to FIGS. 6 through 8, the multilayer ceramic capacitor 200 according to the second exemplary embodiment of the present disclosure may include a ceramic body 210 including a plurality of dielectric layers 211 and having first and second main surfaces opposing each other, first and second side surfaces opposing each other, and first and second end surfaces opposing each other; a first capacitor part C1 including a first internal electrode 221 formed in the ceramic body 210 and exposed to the first end surface S1 and a second internal electrode 222 formed in the ceramic body 210 and exposed to the second end surface S2; second to fifth capacitor parts Cc1 to Cc4 including a third internal electrode 223 having a first lead 223a exposed to the first side surfaces S3, a fourth internal electrode 224 having a second lead 224a exposed to the second side surface S4, a fifth internal electrode 225 having a third lead 225a exposed to the first side surface S3, and a sixth internal electrode 226 having a fourth lead 226a exposed to the second side surface S4, the third to sixth internal electrodes 223 to 226 being formed on one dielectric layer 211 in the ceramic body 210, and a seventh internal electrode 227 formed on another dielectric layer 211 in the ceramic body 210; and a first external electrode 231 formed on the first end surface S1 of the ceramic body 210 and extended to the first and second side surfaces S3 and S4 and the first and second main surfaces S5 and S6 and a second external electrode 232 formed on the second end surface S2 of the ceramic body 210 and extended to the first and second side surfaces S3 and S4 and the first and second main surfaces S5 and S6, wherein the first capacitor part C1 and the second to fifth capacitor parts Cc1 to Cc4 are connected in parallel to each other.

In the second exemplary embodiment of the present disclosure, a groove may be formed in the seventh internal electrode 227 in the same regions thereof as regions in which the third to sixth internal electrodes 223 to 226 are spaced apart from each other.

Figure 9A:
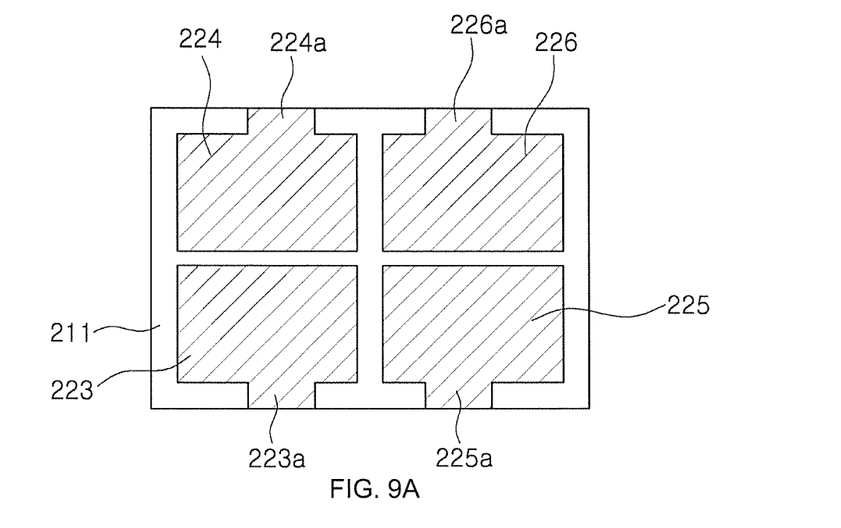
FIGS. 9A and 9B are each a plan diagram illustrating third to seventh internal electrodes used in the multilayer ceramic capacitor according to a third exemplary embodiment of the present disclosure.
Figure 9B:
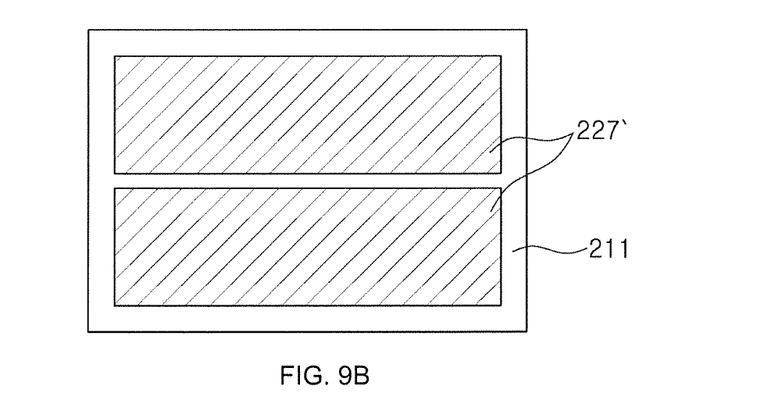

FIGS. 9A and 9B are each a plan diagram illustrating third to seventh internal electrodes used in a multilayer ceramic capacitor according to a third exemplary embodiment of the present disclosure.

Referring to FIGS. 9A and 9B, in the third exemplary embodiment of the present disclosure, a seventh internal electrode 227' may be formed as two electrode patterns spaced apart from each other in a width direction of the ceramic body 210.

Due to such arrangement, in the multilayer ceramic capacitor according to the second and third exemplary embodiments of the present disclosure, three self resonances are observed in impedance characteristics, and a low impedance region may be increased, such that a change in voltage of power and noise may be efficiently decreased.

Therefore, as compared with the structure according to the related art, the impedance may be decreased and controlled in a relatively wide frequency region, and the number of capacitor decoupling may be decreased, such that a mounting space and cost may be decreased due to the decrease in components.

Since other features of the multilayer ceramic capacitor according to the second and third exemplary embodiments of the present disclosure are the same as those of the above-mentioned multilayer ceramic capacitor according to the first exemplary embodiment of the present disclosure, a detailed description thereof will be omitted.

Board Having Multilayer Ceramic Capacitor Mounted Thereon

Figure 10:
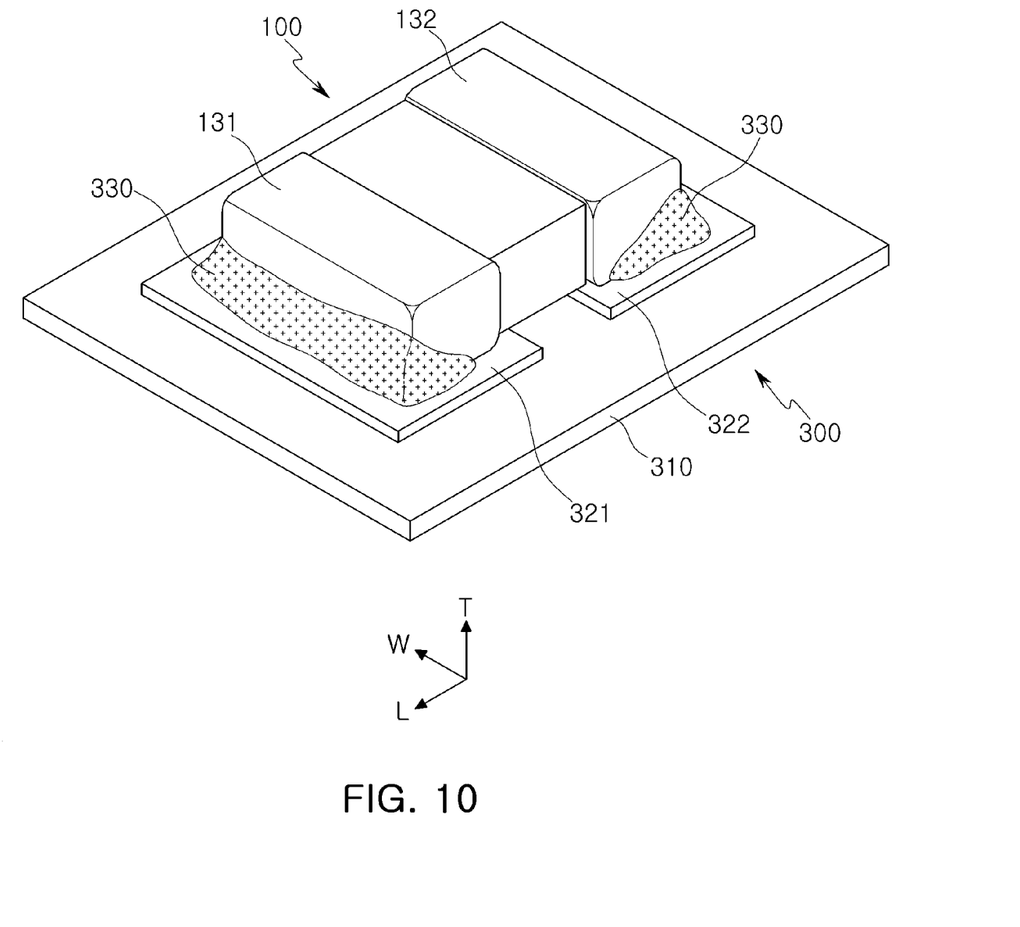
FIG. 10 is a perspective diagram illustrating a form in which the multilayer ceramic capacitor of FIG. 1 is mounted on a printed circuit board.

FIG. 10 is a perspective diagram illustrating a form in which the multilayer ceramic capacitor of FIG. 1 is mounted on a printed circuit board.

Referring to FIG. 10, a board 300 having a multilayer ceramic capacitor 100 mounted thereon according to the exemplary embodiment of the present disclosure may include a printed circuit board 310 on which the multilayer ceramic capacitor 100 is horizontally mounted and first and second electrode pads 321 and 322 formed on the printed circuit board 310 so as to be spaced apart from each other.

In this case, the multilayer ceramic capacitor 100 may be electrically connected to the printed circuit board 310 by soldering in a state in which first and second external electrodes 131 and 132 are positioned on the first and second electrode pads 321 and 322 so as to contact each other, respectively.

In the second to fifth capacitor parts Cc1 to Cc4, the first lead 123a of the third internal electrode 123 and the second lead 124a of the fourth internal electrode 124 may be exposed to the first and second side surfaces S3 and S4 of the ceramic body 110 to thereby be connected to the first external electrode 131.

Further, the third lead 125a of the fifth internal electrode 125 and the fourth lead 126a of the sixth internal electrode 126 may be exposed to the first and second side surfaces S3 and S4 of the ceramic body 110 to thereby be connected to the second external electrode 132.

The second capacitor part Cc1 may be formed in a region in which the third and seventh internal electrodes 123 and 127 are overlapped with each other.

The third capacitor part Cc2 may be formed in a region in which the fourth and seventh internal electrodes 124 and 127 are overlapped with each other.

The fourth capacitor part Cc3 may be formed in a region in which the fifth and seventh internal electrodes 125 and 127 are overlapped with each other.

The fifth capacitor part Cc4 may be formed in a region in which the sixth and seventh internal electrodes 126 and 127 are overlapped with each other.

The first and second internal electrodes 121 and 122 may be disposed in the central portion of the ceramic body 110, and the third to seventh internal electrodes 123 to 127 may be disposed on and below the first and second internal electrodes 121 and 122.

A description of features overlapped with those of the multilayer ceramic capacitor according to the first exemplary embodiment of the present disclosure will be omitted.

Figure 11:
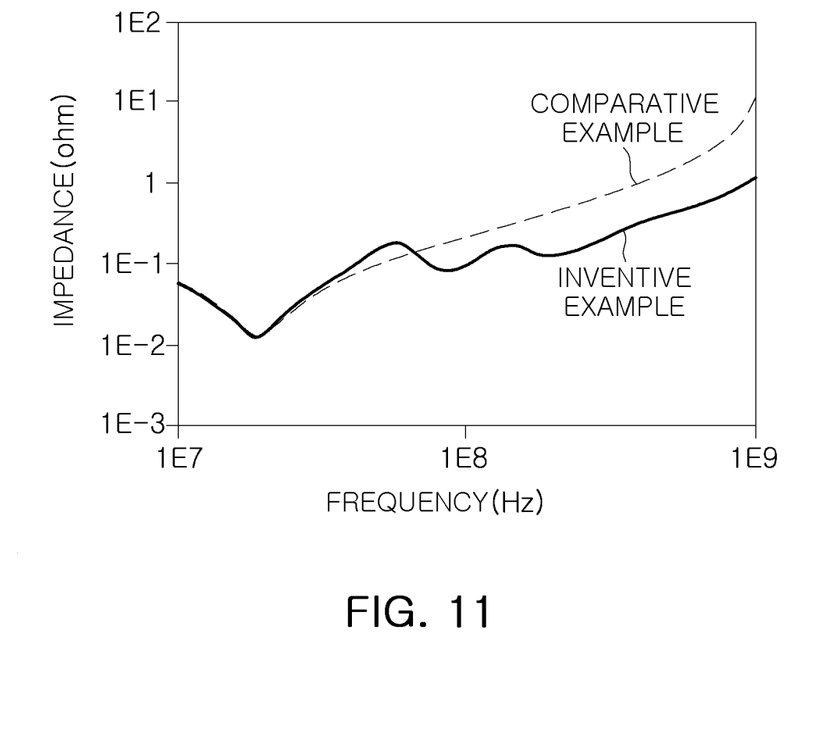
FIG. 11 is a graph for comparing impedances in Inventive Example and Comparative Example.

FIG. 11 is a graph for comparing impedances in Inventive Example and Comparative Example.

Referring to FIG. 11, it may be appreciated that in the multilayer ceramic capacitor according to an exemplary embodiment of the present disclosure, impedance may have a flat shape in a relatively wide frequency region and the impedance may be decreased, as compared to a multilayer ceramic capacitor according to the related art in Comparative Example.

In addition, it may be appreciated that in the multilayer ceramic capacitor according to an exemplary embodiment of the present disclosure, three self resonances are observed in impedance characteristics, and a low impedance region may be increased, such that a change in voltage of power and noise may be efficiently decreased.

According to exemplary embodiments of the present disclosure, in the multilayer ceramic capacitor, three self resonances are observed in impedance characteristics, and a low impedance region may be increased, such that the change in voltage of power and noise may be efficiently decreased.

Therefore, as compared with the structure according to the related art, the impedance in a wider frequency region may be decreased and controlled, and the number of capacitor for decoupling may be decreased, such that a mounting space and cost may be decreased due to the decrease in components.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor, comprising:
a ceramic body including a plurality of dielectric layers, first and second main surfaces opposing each other, first and second side surfaces opposing each other, and first and second end surfaces opposing each other;
a first capacitor part including a first internal electrode disposed in the ceramic body and exposed to the first end surface and a second internal electrode disposed in the ceramic body and exposed to the second end surface;
second to fifth capacitor parts including a third internal electrode having a first lead exposed to the first side surfaces, a fourth internal electrode having a second lead exposed to the second side surface, a fifth internal electrode having a third lead exposed to the first side surface, and a sixth internal electrode having a fourth lead exposed to the second side surface, the third to sixth internal electrodes being disposed on one dielectric layer in the ceramic body, and a seventh internal electrode disposed on another dielectric layer in the ceramic body; and a first external electrode disposed on the first end surface of the ceramic body and extended to the first and second side surfaces and the first and second main surfaces, and a second external electrode disposed on the second end surface of the ceramic body and extended to the first and second side surfaces and the first and second main surfaces, wherein the first capacitor part and the second to fifth capacitor parts are connected in parallel to each other, and wherein the second capacitor part is disposed in a region in which the third and seventh internal electrodes are overlapped with each other.

2. The multilayer ceramic capacitor of claim 1, wherein the first and second internal electrodes are disposed in a central portion of the ceramic body, and the third to seventh internal electrodes are disposed on and below the first and second internal electrodes.

3. The multilayer ceramic capacitor of claim 1, wherein the first lead of the third internal electrode and the second lead of the fourth internal electrode are connected to the first external electrode, and the third lead of the fifth internal electrode and the fourth lead of the sixth internal electrode are connected to the second external electrode.

4. The multilayer ceramic capacitor of claim 1, wherein the third capacitor part is disposed in a region in which the fourth and seventh internal electrodes are overlapped with each other.

5. The multilayer ceramic capacitor of claim 1, wherein the fourth capacitor part is disposed in a region in which the fifth and seventh internal electrodes are overlapped with each other.

6. The multilayer ceramic capacitor of claim 1, wherein the fifth capacitor part is disposed in a region in which the sixth and seventh internal electrodes are overlapped with each other.

7. The multilayer ceramic capacitor of claim 1, wherein the seventh internal electrode has a groove disposed in the same regions as regions in which the third to sixth internal electrodes are spaced apart from each other.

8. The multilayer ceramic capacitor of claim 1, wherein the seventh internal electrode is disposed as two electrode patterns spaced apart from each other in a width direction of the ceramic body.

9. A board comprising:
a printed circuit board having first and second electrode pads; and
a multilayer ceramic capacitor mounted on the printed circuit board,
wherein the multilayer ceramic capacitor includes a ceramic body including a plurality of dielectric layers, first and second main surfaces opposing each other, first and second side surfaces opposing each other, and first and second end surfaces opposing each other, a first capacitor part including a first internal electrode disposed in the ceramic body and exposed to the first end surface and a second internal electrode disposed in the ceramic body and exposed to the second end surface, second to fifth capacitor parts including a third internal electrode having a first lead exposed to the first side surface, a fourth internal electrode having a second lead exposed to the second side surface, a fifth internal electrode having a third lead exposed to the first side surface, and a sixth internal electrode having a fourth lead exposed to the second side surface, the third to sixth internal electrodes being disposed on one dielectric layer in the ceramic body, and a seventh internal electrode disposed on another dielectric layer in the ceramic body, and a first external electrode disposed on the first end surface of the ceramic body and extended to the first and second side surfaces and the first and second main surfaces and a second external electrode disposed on the second end surface of the ceramic body and extended to the first and second side surfaces and the first and second main surfaces, the first capacitor part and the second to fifth capacitor parts being connected in parallel to each other, wherein the second capacitor part is disposed in a region in which the third and seventh internal electrodes are overlapped with each other.

10. The board of claim 9, wherein the first and second internal electrodes are disposed in a central portion of the ceramic body, and the third to seventh internal electrodes are disposed on and below the first and second internal electrodes.

11. The board of claim 9, wherein the first lead of the third internal electrode and the second lead of the fourth internal electrode are connected to the first external electrode, and the third lead of the fifth internal electrode and the fourth lead of the sixth internal electrode are connected to the second external electrode.

12. The board of claim 9, wherein the third capacitor part is disposed in a region in which the fourth and seventh internal electrodes are overlapped with each other.

13. The board of claim 9, wherein the fourth capacitor part is disposed in a region in which the fifth and seventh internal electrodes are overlapped with each other.

14. The board of claim 9, wherein the fifth capacitor part is disposed in a region in which the sixth and seventh internal electrodes are overlapped with each other.

15. The board of claim 9, wherein the seventh internal electrode has a groove disposed in the same regions as regions in which the third to sixth internal electrodes are spaced apart from each other.

16. The board of claim 9, wherein the seventh internal electrode is disposed as two electrode patterns spaced apart from each other in a width direction of the ceramic body.

* * * * *